(12) United States Patent
Ham et al.

(10) Patent No.: US 7,372,265 B2
(45) Date of Patent: May 13, 2008

(54) COMPENSATION OF MAGNETIC FIELD DISTURBANCES DUE TO VIBRATIONS IN AN MRI SYSTEM

(75) Inventors: Cornelis Leonardus Gerardus Ham, Eindhoven (NL); Wilhelmus Reinerius Maria Mens, Eindhoven (NL); Johannes Petrus Groen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/544,513

(22) PCT Filed: Jan. 29, 2004

(86) PCT No.: PCT/IB2004/050061

§ 371 (c)(1),
(2), (4) Date: Aug. 4, 2005

(87) PCT Pub. No.: WO2004/070412

PCT Pub. Date: Aug. 19, 2004

(65) Prior Publication Data

US 2006/0145699 A1 Jul. 6, 2006

(30) Foreign Application Priority Data

Feb. 5, 2003 (EP) ................................. 03100233

(51) Int. Cl.
*G01V 3/00* (2006.01)
(52) U.S. Cl. ..................... 324/307; 324/318; 324/314; 324/313
(58) Field of Classification Search ........ 324/307–322, 324/300; 600/410, 422
See application file for complete search history.

(56) References Cited

U.S. PATENT DOCUMENTS 4,698,591 A * 10/1987 Glover et al. ............... 324/307
4,965,521 A * 10/1990 Egloff ......................... 324/312

(Continued)

FOREIGN PATENT DOCUMENTS

EP 0 533 173 A1 3/1993

(Continued)

OTHER PUBLICATIONS

Mechefske, C.K., et al.; Characterization of Acoustic Noise and Magnetic Field Fluctuations in a 4T Whole Body MRI Scanner; 2002; Mechanical Systems and Signal Processing; 16(2-3): 459-473.

*Primary Examiner*—Brij Shrivastav
*Assistant Examiner*—Tiffany A. Fetzner

(57) ABSTRACT

A magnetic resonance imaging (MRI) system includes an examination volume (9), a main magnet system (17) for generating a main magnetic field ($B_0$) in the examination volume, a gradient magnet system (25) for generating gradients of the main magnetic field, and a control system (37) for compensating disturbances of the magnetic field caused by mechanical vibrations of the MRI system. The control system is a feed-forward control system which determines a necessary compensation for said disturbances in dependence on an electric current in the gradient magnet system according to a predetermined response relation. Since in most MRI systems the mechanical vibrations are predominantly caused by the altering electric currents in the gradient magnet system and by eddy currents induced thereby, an accurate and reliable compensation for said disturbances is provided, so that artifacts and other distortions of the reconstructed image caused by said disturbances are considerably reduced.

13 Claims, 3 Drawing Sheets

U.S. PATENT DOCUMENTS

| | | | |
|---|---|---|---|
| 5,278,503 A * | 1/1994 | Keller et al. | 324/318 |
| 5,332,969 A * | 7/1994 | Tsuruno et al. | 324/309 |
| 5,545,996 A * | 8/1996 | Morich et al. | 324/318 |
| 5,742,164 A * | 4/1998 | Roemer et al. | 324/318 |
| 6,147,494 A * | 11/2000 | Ham | 324/318 |
| 6,294,913 B1 * | 9/2001 | Hinks et al. | 324/309 |
| 6,329,821 B1 | 12/2001 | Zhou | |
| 6,380,738 B1 | 4/2002 | Zhou | |
| 6,396,268 B1 * | 5/2002 | Hinks et al. | 324/307 |
| 6,396,272 B1 | 5/2002 | Dietz et al. | |
| 6,501,275 B1 * | 12/2002 | Westphal | 324/319 |
| 6,504,373 B2 * | 1/2003 | Tsuda | 324/322 |
| 6,515,478 B1 * | 2/2003 | Wicklow et al. | 324/313 |
| 6,518,761 B2 | 2/2003 | Roozen et al. | |
| 6,538,443 B2 * | 3/2003 | Morich et al. | 324/318 |
| 6,549,010 B2 | 4/2003 | Roozen et al. | |
| 6,567,685 B2 * | 5/2003 | Takamori et al. | 600/410 |
| 6,694,498 B2 | 2/2004 | Conrad et al. | |
| 6,864,682 B2 | 3/2005 | Fontius et al. | |
| 6,954,068 B1 * | 10/2005 | Takamori et al. | 324/318 |
| 7,034,537 B2 * | 4/2006 | Tsuda et al. | 324/320 |
| 2001/0010464 A1 * | 8/2001 | Takamori et al. | 324/304 |
| 2001/0013778 A1 * | 8/2001 | Tsuda | 324/307 |
| 2002/0079895 A1 | 6/2002 | Roozen et al. | |
| 2002/0079896 A1 | 6/2002 | Roozen et al. | |
| 2004/0032260 A1 | 2/2004 | Fontius et al. | |
| 2004/0113616 A1 * | 6/2004 | Markl et al. | 324/307 |
| 2004/0113620 A1 * | 6/2004 | Tsuda et al. | 324/320 |
| 2004/0178792 A1 | 9/2004 | Edelstein | |
| 2006/0076954 A1 * | 4/2006 | Kimmlingen et al. | 324/320 |
| 2006/0145699 A1 * | 7/2006 | Ham et al. | 324/322 |

FOREIGN PATENT DOCUMENTS

| | | |
|---|---|---|
| EP | 1 054 263 A1 | 11/2000 |
| JP | WO 2002/071942 A1 * | 9/2002 |
| WO | WO 93/14414 A1 | 7/1993 |

* cited by examiner

COMPENSATION OF MAGNETIC FIELD DISTURBANCES DUE TO VIBRATIONS IN AN MRI SYSTEM

BACKGROUND

The invention relates to a magnetic resonance imaging (MRI) system comprising an examination volume, a main magnet system for generating a main magnetic field in the examination volume, a gradient magnet system for generating gradients of the main magnetic field, and a control system for compensating disturbances of the magnetic field caused by mechanical vibrations of the MRI system.

In general, the main portions of an MRI system, like the main magnet system and the gradient magnet system, are subject to mechanical vibrations during operation. These vibrations are caused by environmental disturbances, such as floor vibrations or movements of the patient in the MRI system, and also by internal disturbances, such as the altering Lorentz forces which are exerted on the electric coils of the gradient magnet system as a result of the interaction between the main magnetic field and the altering electric currents in said coils. The vibrations lead to unwanted time-dependent and periodical disturbances of the magnetic field in the examination volume. As a result of said disturbances of the magnetic field, the spatial definition of the magnetic field in the examination volume is not sufficiently accurate, so that artifacts and other distortions are introduced into the reconstructed image of the subject to be examined in the examination volume.

An MRI system of the kind mentioned in the opening paragraph is known from U.S. Pat. No. 6,396,268. The known MRI system is of the so-called open type, in which the main magnet system is accommodated in a magnet top half and in a magnet bottom half between which the examination volume is present. The magnet top half and the magnet bottom half are held at a pre-determined distance from each other by means of a vertical support post. The control system of the known MRI system comprises a feed-back control loop having a sensor, which is mounted on the support post and measures disturbances of the magnetic field. In the known MRI system said disturbances are mainly caused by mutual position changes of the magnet top half and the magnet bottom half. The sensor generates a magnetic field change signal which is supplied to a controller. The controller converts the magnetic field change signal into a compensation signal which corresponds to a desired compensation for the measured disturbances of the magnetic field. In a first embodiment, the known MRI system comprises a number of compensation coils which actively generate a compensating magnetic field for the measured disturbances of the magnetic field, the compensation signal corresponding to a desired electric current in the compensating coils. In a second embodiment, the compensation signal is supplied to a transceiver of the MRI system which controls the RF transceiver coils of the MRI system. For a desired selected position in the examination volume, the transceiver compensates the frequency of the RF signals transmitted by the RF transceiver coils for the measured disturbances of the magnetic field, so that the position actually selected is not influenced by the disturbances of the magnetic field. In a third embodiment, a compensating magnetic field is generated by the gradient magnet system. In this embodiment the compensation signal corresponds to a desired additional compensating electric current which is supplied to the gradient magnet system, the compensation signal being added to the driving signal of the coils of the gradient magnet system.

A disadvantage of the known MRI system is that the compensation of the disturbances of the magnetic field achieved by means of the control system is not sufficiently accurate. A first reason is that the sensor does not measure the disturbances of the magnetic field in the examination volume, i.e. at the location where the disturbances of the magnetic field should be compensated. It is not practical or even impossible to arrange the sensor in the examination volume. A second reason is that the magnetic field at the location of the sensor is influenced by the gradient magnet system, so that the sensor does not solely measure the disturbances of the main magnetic field.

SUMMARY

It is an object of the present invention to provide a magnetic resonance imaging (MRI) system of the kind mentioned in the opening paragraph in which disturbances of the magnetic field in the examination volume caused by mechanical vibrations of the MRI system are compensated in a more accurate and reliable manner, so that artifacts and other distortions of the reconstructed image are further reduced.

In order to achieve this object, a magnetic resonance imaging (MRI) system in accordance with the invention is characterized in that the control system has an input for receiving an input signal corresponding to an electric current in the gradient magnet system and an output for providing a compensating output signal which is determined by the control system in dependence on the input signal according to a predetermined response relation.

The invention is based on the insight that the mechanical vibrations of the MRI system are mainly caused by the altering Lorentz forces, which are exerted on the gradient magnet system as a result of the interaction of the main magnetic field and the altering electric currents in the gradient magnet system, and by the altering Lorentz forces which are exerted on other parts of the MRI system as a result of the interaction of the main magnetic field and the eddy currents which are induced in these parts by the altering magnetic field of the gradient magnet system. The magnitude and frequency of these main vibrations substantially depend on the electric currents in the gradient magnet system.

Based on this insight, the control system of the MRI system in accordance with the invention is a feed-forward control system which determines the necessary compensation of the magnetic field in dependence on the actual electric currents in the gradient magnet system. As the main vibrations mentioned before substantially depend on the electric currents in the gradient magnet system, an accurate relation can be determined, for example by means of measurements, between said electric currents and the disturbances of the magnetic field caused by said main vibrations. An accurate relation can also be determined between the compensating output signal of the control system and the compensation of the magnetic field actually achieved as a result of the compensating output signal. The response relation, according to which the control system determines the compensating output signal in dependence on the input signal, i.e. in dependence on the electric current in the gradient magnet system, can be accurately predetermined on the basis of the two relations mentioned before. As a result, an accurate and reliable compensation of the disturbances of the magnetic field caused by mechanical vibrations of the MRI system is obtained.

During the predetermination of the response relation, the disturbances of the magnetic field and the achieved compensations can be measured in the examination volume, i.e. at the location where the disturbances of the magnetic field should be compensated. Furthermore, during said predetermination, disturbances of the main magnetic field and disturbances of the gradients of the magnetic field can be separately determined. This is an advantage because these two types of disturbances can be best compensated in separate manners, i.e. disturbances of the main magnet field can be best compensated by means of a compensating magnetic field of a separate compensation coil or by compensating the frequency of the RF signals used in the MRI method, and disturbances of the gradients of the magnetic field can be best compensated by means of an additional compensating magnetic field generated by the gradient magnet system or by separate compensation coils.

A particular embodiment of an MRI system in accordance with the invention is characterized in that the examination volume is arranged between a first magnet unit and a second magnet unit arranged at a distance from the first magnet unit wherein the first and the second magnet unit comprise a first portion and a second portion, respectively, of the main magnet system and a first portion and a second portion, respectively, of the gradient magnet system, wherein the first and the second magnet unit are interconnected via two posts which are arranged substantially diametrically opposite each other with respect to an isocenter of the examination volume, wherein a main input signal of the control system corresponds to an electric current in an X-coil of the gradient magnet system, which generates a gradient of the magnetic field along an X-axis extending perpendicularly to an imaginary plane in which the two posts extend, and wherein a main output signal of the control system corresponds to a compensating electric current which is supplied to the X-coil for generating a compensating gradient of the magnetic field along the X-axis.

In said particular embodiment the MRI system is of the so-called open type which provides improved comfort for the patient in the examination volume and improved accessibility of the examination volume. This particular embodiment is based on the insight that, as a result of the fact that the two posts are arranged diametrically opposite each other with respect to the isocenter of the examination volume, the altering Lorentz forces exerted on the gradient magnet system mainly lead to rotational vibrations of the first and the second magnet unit with respect to each other about an axis, which extends in the imaginary plane in which the two posts extend and perpendicularly to the direction of the main magnetic field in the examination volume. This particular embodiment is further based on the insight that said rotational vibrations mainly lead to disturbances of the gradient of the magnetic field generated along the X-axis, and on the insight that said disturbances can be best compensated by means of an additional compensating magnetic field generated by the X-coil of the gradient magnet system.

Advantages of the present application will be apparent to those of ordinary skill in the art upon reading and understanding the following detailed description.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION

Figure 1:
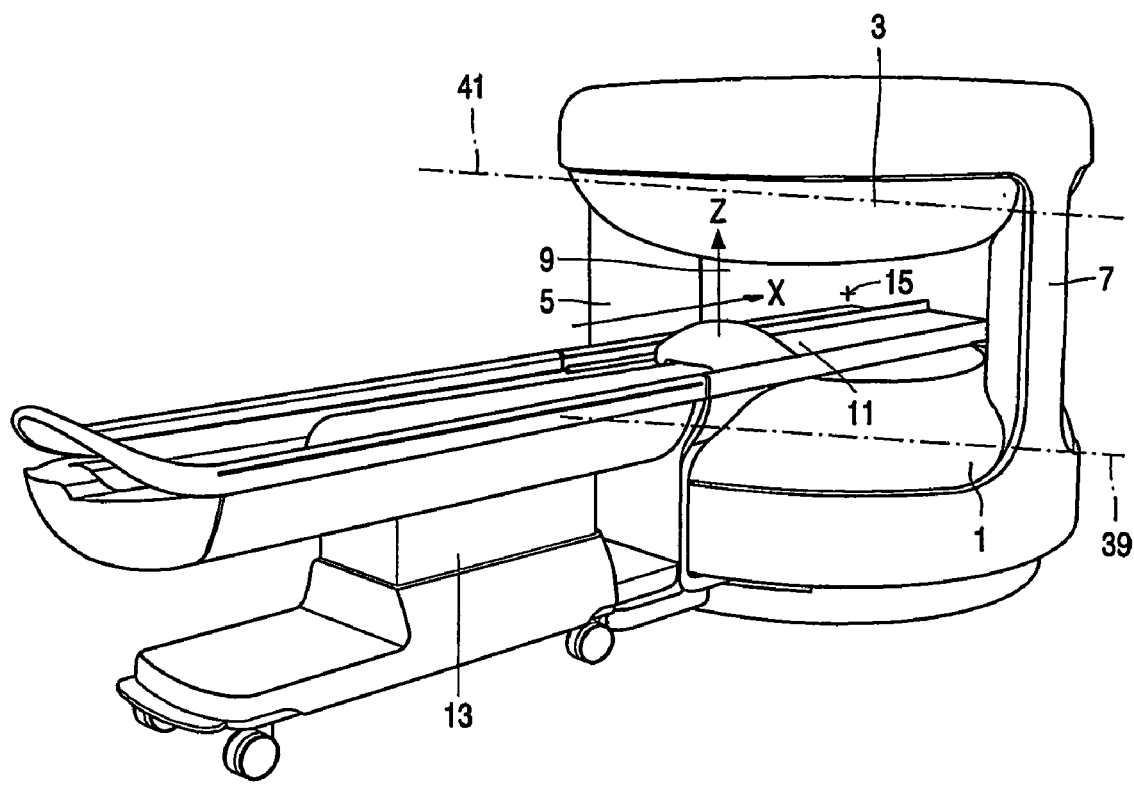
FIG. 1 shows an MRI system in accordance with the invention.

The magnetic resonance imaging (MRI) system in accordance with the invention as shown in FIG. 1 is an MRI system of the so-called open type and comprises a first or lower magnet unit 1 and a second or upper magnet unit 3, which is arranged at a vertical distance from the first magnet unit 1 and is connected to the first magnet unit 1 via two vertical posts 5 and 7. Between the first magnet unit 1 and the second magnet unit 3 an examination volume 9 is present in which a patient to be examined can be positioned. For this purpose, the MRI system comprises a horizontal patient bed 11 which can be moved into the examination volume 9 from a trolley 13. In the embodiment shown the two posts 5, 7 are arranged substantially diametrically opposite each other with respect to an isocenter 15 of the examination volume 9. In this manner the examination volume 9 is easily accessible for the patient and for the medical personnel in the direction of an X-axis which extends perpendicularly to an imaginary plane in which the two posts 5, 7 extend. Furthermore, oppressive feelings of the patient in the examination volume 9, which the patient may have particularly if the patient suffers from claustrophobia, are considerably reduced.

Figure 2:
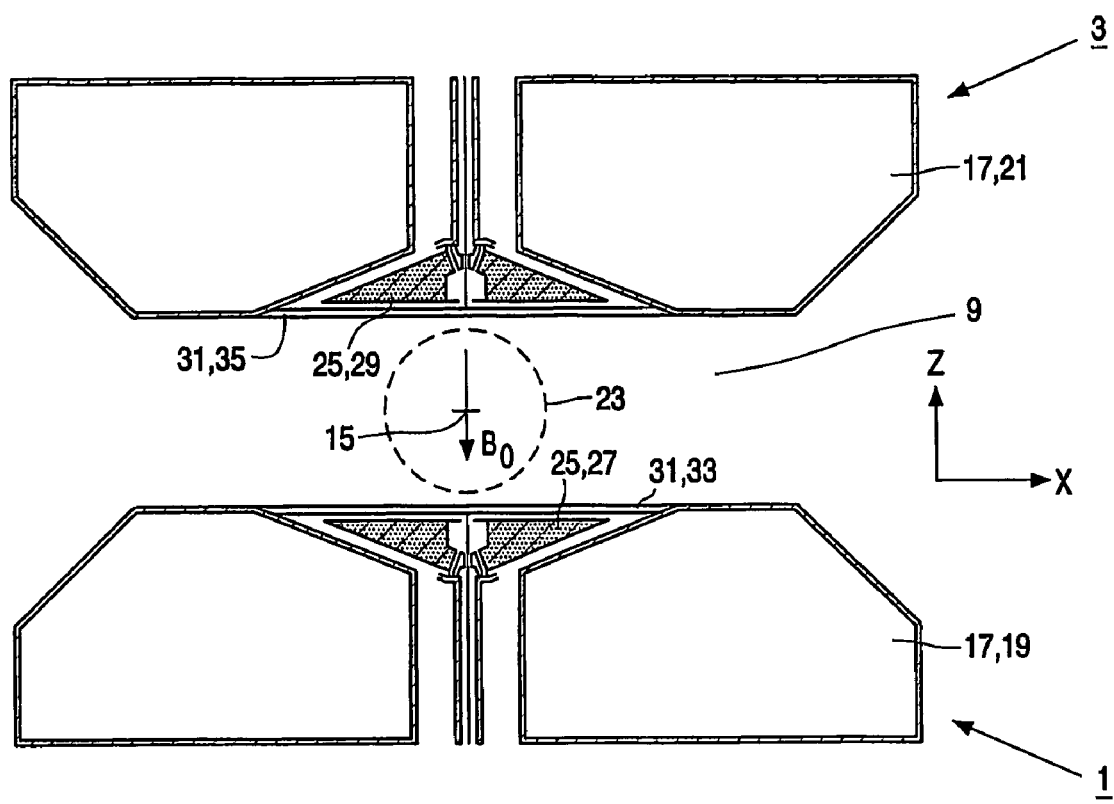
FIG. 2 shows a diagrammatic cross-section of the MRI system of FIG. 1.

The MRI system is suitable for making images of the entrails of the patient's body by means of a nuclear magnetic resonance method, which is known per se and will not be described in detail. For this purpose, as shown in FIG. 2, the MRI system comprises a main magnet system 17 having a first portion 19 accommodated in the first magnet unit 1 and a second portion 21 accommodated in the second magnet unit 3. The main magnet system 17 comprises a number of superconducting electric coils, not shown in FIG. 2, accommodated in cryogenic containers, for generating a substantially homogeneous main magnetic field $B_0$ in the vertical Z-direction in a central portion 23 of the examination volume 9. The MRI system further comprises a gradient magnet system 25 having a first portion 27 accommodated in the first magnet unit 1 and a second portion 29 accommodated in the second magnet unit 3. The gradient magnet system 25 comprises a number of electric coils, not shown in FIG. 2, for generating altering gradients of the magnetic field in the central portion 23 of the examination volume 9. The MRI system also comprises an RF transmitting and receiving system 31 having a first portion 33 accommodated in the first magnet unit 1 and a second portion 35 accommodated in the second magnet unit 3. The RF transmitting and receiving system 31 comprises a number of RF transmitting and receiving coils, not shown in FIG. 2, for transmitting RF signals to and receiving RF signals from the central portion 23 of the examination volume 9.

Since the first portion 27 and the second portion 29 of the gradient magnet system 25 are present in the magnetic field of the main magnet system 17, altering Lorentz forces are exerted during operation on the electric coils of the gradient magnet system 25 as a result of the interaction between the magnetic field of the main magnet system 17 and the altering electric currents, which are supplied to said coils for generating the altering gradients of the magnetic field in the central portion 23 of the examination volume 9. The altering Lorentz forces lead to mechanical vibrations and deformations of the gradient magnet system 25. Since the gradient magnet system 25 is mechanically coupled to the main magnet system 17, said vibrations are also transmitted to the main magnet system 17 and to other portions of the MRI system. Another source of vibrations within the MRI system are the eddy currents which are induced by the altering magnetic field of the gradient magnet system 25 in electrically conductive portions of the MRI system. The interaction between the magnetic field of the main magnet system 17 and said eddy currents leads to altering Lorentz forces being exerted on said conductive portions and, consequently, to mechanical vibrations and deformations of said conductive portions. An example are the cryogenic containers in which the superconductive coils of the main magnet system 17 are accommodated. Said mechanical vibrations and deformations of the main portions of the MRI system lead to unwanted time-dependent and periodical disturbances of the magnetic field in the central portion 23 of the examination volume 9. As a result of said disturbances of the magnetic field, the homogeneity of the main magnetic field $B_0$ and the accuracy of the spatial definition of the gradients of the magnetic field in the central portion 23 are insufficient, so that artifacts and other distortions are introduced into the reconstructed image of the patient.

Figure 3:
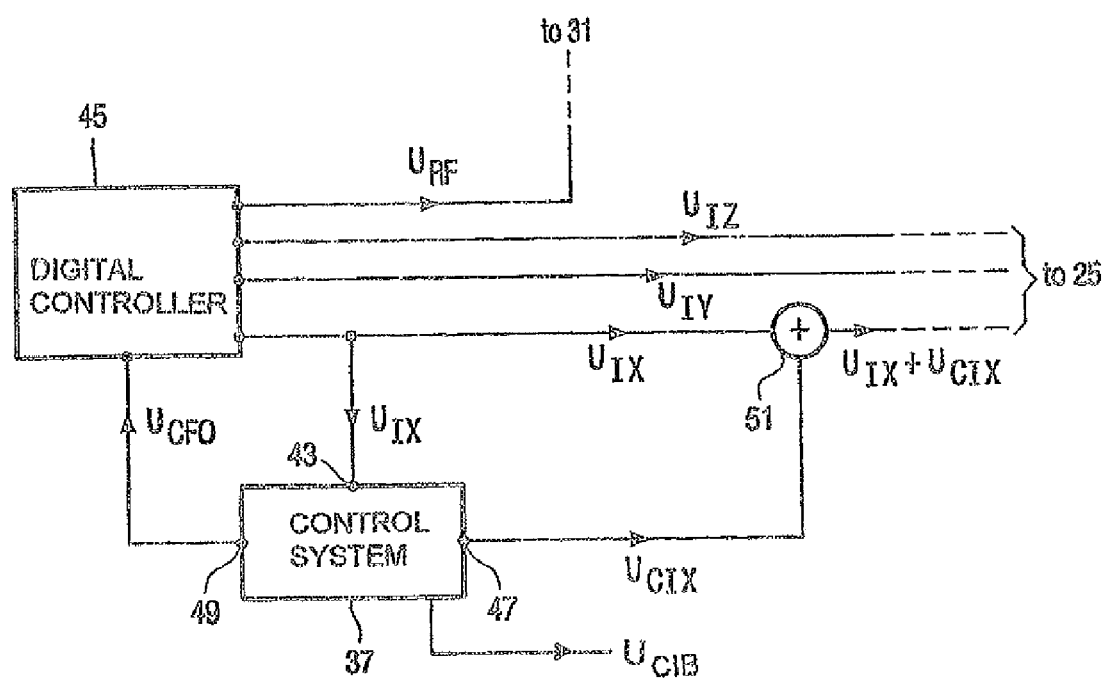
FIG. 3 diagrammatically shows a control system of the MRI system of FIG. 1.

In order to reduce artifacts and other distortions of the reconstructed image caused by mechanical vibrations in the MRI system, the MRI system in accordance with the invention is provided with a control system 37, shown in FIG. 3, for compensating disturbances of the magnetic field in the central portion 23 of the examination volume 9 caused by mechanical vibrations in the MRI system. The constitution and operation of the control system 37 are based on two insights. The first insight is that, as a result of the fact that the two posts 5, 7 are arranged diametrically opposite each other with respect to the isocenter 15, the altering Lorentz forces exerted on the gradient magnet system 25 and on other electrically conductive portions of the MRI system mainly lead to rotational vibrations of the first magnet unit 1 and the second magnet unit 3 about axes 39, 41 shown in FIG. 1, which extend in the imaginary plane in which the two posts 5, 7 extend and perpendicularly to the Z-direction. Said rotational vibrations mainly lead to disturbances of the gradients generated by the gradient magnet system 25 along the X-axis and, to a much lesser extent, to disturbances of the main magnetic field $B_0$. The second insight is that the magnitude and the frequency of the disturbances of the magnetic field in the central portion 23 depend on the magnitude and the frequency of said rotational vibrations. The magnitude and the frequency of said rotational vibrations mainly depend on the magnitude and the frequency of the Lorentz forces exerted on the X-coils of the gradient magnet system 25, i.e. the electric coils which generate the gradients along the X-axis. As the magnitude and the frequency of said Lorentz forces depend on the electric current supplied to said X-coils, the magnitude and the frequency of the disturbances of the magnetic field in the central portion 23 mainly depend on the electric currents supplied to said X-coils.

Based on these insights, the control system 37, shown in FIG. 3, is a feed-forward control system having an electrical input 43 for receiving an input signal $u_{IX}$ which corresponds to the electric current supplied to the X-coils of the gradient magnet system 25. The input signal $u_{IX}$ is supplied by a digital controller 45 of the MRI system, which controls the pulse sequences of the gradient magnet system 25 and the RF transmitting and receiving system 31 and which, for this purpose, supplies the electrical signal $u_{IX}$ and similar electrical signals $u_{IY}$, $u_{IZ}$ to the power amplifiers of the gradient magnet system 25 and an electrical signal $u_{RF}$ to the power amplifier of the RF transmitting and receiving system 31. The control system 37 further has a first electrical output 47, which provides a first compensating output signal $u_{CIX}$, and a second electrical output 49, which provides a second compensating output signal $u_{CF0}$.

The first compensating output signal $u_{CIX}$ corresponds to a compensating electric current supplied to the X-coils of the gradient magnet system 25 for generating a compensating gradient of the magnetic field along the X-axis in the central portion 23. The first output signal $u_{CIX}$ is such that said compensating gradient has substantially the same magnitude as, but is opposite to, the disturbance of the gradient along the X-axis. The control system 37 determines the first output signal $u_{CIX}$ in dependence on the input signal $u_{IX}$ according to a predetermined first response relation, which is stored in a memory of the control system 37. The first response relation is predetermined, for example, by means of a measurement of a relation, which is present between the electric current in the X-coils of the gradient magnet system 25 and the disturbance of the gradient of the magnetic field along the X-axis, and by means of a measurement or calculation of a relation, which is present between the compensating electric current in the X-coils of the gradient magnet system 25 and the compensating gradient of the magnetic field along the X-axis. On the basis of said two relations, the first response relation can be accurately predetermined. Said measurements, necessary to determine the first response relation, can be carried out in the central portion 23 of the examination volume 9, so that the accuracy of the first response relation is further improved. As a result, an accurate and reliable compensation of the disturbance of the gradient of the magnetic field along the X-axis is obtained. The first output signal $u_{CIX}$ is added to the signal $u_{IX}$ by means of a signal adder 51.

The second compensating output signal $u_{CF0}$ corresponds to a compensation of the frequency and phases of the RF signals transmitted by the RF transmitting coils of the RF transmitting and receiving system 31. Said compensation of the frequency is such that, in a position of the central portion 23 selected by the gradient magnet system 25, the frequency of the RF signal is adapted to the disturbance of the main magnetic field $B_0$ in said position, so that the intended nuclear magnetic resonance effects actually occur in the position which is selected by means of the gradient magnet system 25. The second output signal $u_{CF0}$ is supplied to the digital controller 45, which correspondingly adapts the electrical signal $u_{RF}$. The control system 37 determines the second output signal $u_{CF0}$ in dependence on the input signal $u_{IX}$ according to a predetermined second response relation, which is stored in a memory of the control system 37. The second response relation is predetermined, for example, by means of a measurement of a relation, which is present between the electric current in the X-coils of the gradient magnet system 25 and the disturbance of the main magnetic field $B_0$ in the central portion 23. The necessary compensation of the frequency of the RF signal can be directly deduced from said disturbance, since the necessary nuclear magnetic resonance frequency is proportional to the magnitude of the main magnetic field $B_0$. On the basis of said relation, the second response relation can be accurately predetermined. Said measurements, necessary to determine the second response relation, can be carried out in the central portion 23 of the examination volume 9, so that the accuracy of the second response relation is further improved. As a result, an accurate and reliable compensation of the disturbance of the main magnetic field $B_0$ is obtained.

It is noted that the MRI system in accordance with the invention may also be provided with a separate compensation coil or a set of compensation coils for compensating the disturbances of the magnetic field caused by mechanical vibrations of the system. Thus, in the embodiment described before, the first output signal $u_{CIX}$ may be supplied to a separate compensation coil or a set of compensation coils which generate the compensating gradient of the magnetic field along the X-axis. Similarly, a separate compensating coil or a set of compensation coils may be provided for generating the necessary compensation of the disturbance of the main magnetic field $B_0$. In such an embodiment, instead of the second output signal $u_{CF0}$, the control system 37 generates a second output signal $u_{CIB}$, which corresponds to an electric current in the compensation coil or in the set of compensation coils, on the basis of a predetermined response relation.

In the MRI system described before the control system 37 provides two compensating output signals $u_{CIX}$ and $u_{CF0}$, which are determined by the control system 37 in dependence on one single input signal $u_{IX}$. It is noted that the invention also encloses embodiments in which the control system supplies another number of output signals and embodiments in which the control system receives another number of input signals. Examples of such alternative embodiments are a control system which supplies a single compensating output signal for compensating the main magnetic field $B_0$ in dependence on three input signals corresponding to the electric currents in the X-coils, the Y-coils, and the Z-coils, respectively, and a control system which supplies a compensating output signal for compensating the main magnetic field $B_0$ and three compensating output signals for compensating the X-gradient, the Y-gradient, and the Z-gradient, respectively, in dependence on three input signals corresponding to the electric currents in the X-coils, the Y-coils, and the Z-coils, respectively. In general, the number and kind of necessary input signals and the number and kind of necessary output signals depend on the constitution of the MRI system.

It is further noted that the invention also encloses embodiments of an MRI system of the so-called closed cylindrical type, which have a closed cylindrical examination volume surrounded by a tubular gradient magnet system and a tubular main magnet system. In such an embodiment an important additional source of disturbances of the magnetic field in the examination volume are the mechanical vibrations of the cylindrical eddy-current shield, which may be arranged between the gradient magnet system and the main magnet system. Said vibrations are mainly caused by the interaction between the main magnetic field and the eddy currents, which are induced in the eddy-current shield by the altering magnetic field of the gradient magnet system. Since these vibrations mainly depend on the electric currents in the gradient magnet system, the disturbances of the magnetic field caused by said vibrations can be effectively compensated by means of a control system as described before having a suitable response relation.

It is finally noted that the control system 37 may, for example, be an analogue electrical control system or a digital control system. The control system 37 may also be a software module incorporated in the digital controller 45. Accordingly, the expressions "input", "output", "input signal", and "output signal" in the claims have meanings which correspond with the embodiment used for the control system.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A magnetic resonance imaging apparatus comprising:
   a main magnet system configured to generate a main magnetic field in a central portion of an examination region;
   an RF transmitting and receiving system configured to transmit RF signals into and receive RF signals from the examination region;
   a gradient magnet system configured to generate magnetic field gradients in the central portion of the examination region;
   an electronic controller configured to generate a plurality of control signals for controlling the gradient magnet system; and
   a feed-forward control system configured to receive the gradient magnet system control signals and generate an output signal configured for adjusting:
   the RF transmitting and receiving system in order to adjust at least one of the transmitted and received RF signals in accordance with the received control signals; and
   a display configured for displaying images reconstructed from the RF signals received from the examination region.

2. The magnetic resonance imaging apparatus as set forth in claim 1 wherein the feed-forward control system includes:
   an input configured to receive an input signal representative of at least one of the control signals; and
   an output configured to output a first output signal.

3. The magnetic resonance imaging apparatus as set forth in claim 2 wherein the feed-forward control system further includes:
   a memory configured to store a relationship between the input signal and the first output signal.

4. The magnetic resonance imaging apparatus as set forth in claim 1 wherein the output signal is generated in relation to disturbances of at least one of the main and gradient magnetic field in the central portion of the examination region.

5. The magnetic resonance imaging apparatus as set forth in claim 4 wherein the disturbances are measured in the central portion of the examination region.

6. A magnetic resonance system comprising:
   main magnetic field coils which are configured to generate a main magnetic field through an examination volume;
   gradient magnetic field coils which are configured to generate magnetic field gradients in the main magnetic field in response to alternating currents applied to the gradient magnetic field coils, the gradient magnetic fields inducing eddy currents in mechanical structures supporting the main and gradient magnetic field coils, interaction of the alternating electric currents and the eddy currents with the main magnetic field resulting in alternating Lorentz forces which cause mechanical vibrations in the mechanical supporting structures, the alternating Lorentz forces induced vibrations causing (a) disturbances in the main magnetic field and (b) disturbances in the magnetic field gradients;

an RF system configured to transmit RF signals into the examination volume and receive RF resonance signals from the examination volume;

a control system which is configured to compensate for the disturbances in the main magnetic field and the magnetic field gradients, the control system compensating for the disturbances in the main magnetic field by:

controlling the RF system to compensate for a frequency of at least one of the RF signals transmitted into the examination or the RF resonance signal received from the examination volume; and a display configured to display a magnetic resonance image of a subject in the examination volume.

7. The magnetic resonance system according to claim 6, wherein the control system is configured to compensate for disturbances in the magnetic field gradients by modifying the alternating currents applied to the gradient magnetic field coils.

8. The magnetic resonance system according to claim 6, wherein the main magnetic field coils include first and second coils disposed on opposite sides of the examination volume and further including first and second posts that connect the first and second coils.

9. The magnetic resonance system according to claim 8, wherein the first and second posts are disposed 180° oppositely and symmetrically relative to an isocenter of the examination volume.

10. A method of magnetic resonance imaging comprising the steps of:

generating a main magnetic field in a central portion of an examination region;

with an RF coil, transmitting RF signals into the examination region, or receiving RF signals from the examination region;

with a gradient coil, generating gradient magnetic fields in the main magnetic field in the central portion of the examination region which gradient magnetic fields induce mechanical vibrations that disturb the main magnetic field;

generating a first input signal related to generating the gradient magnetic fields in the examination region;

compensating for the mechanical vibration induced disturbances in the main magnetic field by modifying a frequency of at least one of the RF signals used in an transmitted into or received from the imaging examination in accordance with the first input signal; and generating A display of a subject in the examination region using RF signals received from the examination region.

11. The method of magnetic resonance imaging according to claim 10 wherein compensating for mechanical vibration induced variations in the main magnetic field includes:

generating a feed-forward first compensating output signal related to the first input signal;

combining the first input signal and the feed-forward first compensating output signal;

applying the combined signal to a gradient coil to generate the gradient magnetic field.

12. The method of magnetic resonance imaging according to claim 10 further comprising the steps of:

measuring, in the central portion, disturbances in main magnetic field in the central portion of the examination region which result from forces related to generating the gradient magnetic field; and storing in a memory, relations between the disturbances and at least one of the compensating magnetic fields and the modifications to the frequency of at least one of the transmitted and received RF signals.

13. An MRI system comprising:

an examination volume arranged between a first magnet unit and a second magnet unit arranged at a distance from the first magnet unit, the first and the second magnet units comprising:

a first portion and a second portion, respectively, of a main magnet system configured for generating a main ($B_0$) magnetic field in the examination volume and a first portion and a second portion, respectively, of a gradient magnet system configured for generating gradients in the main ($B_0$) magnetic field, the first and the second magnet units being interconnected via two posts which are arranged substantially 180° diametrically opposite each other in an imaging plane that intersects an isocenter of the examination volume and in which the first and second posts extend, an electronic control system configured for compensating disturbances of the main ($B_0$) magnetic field caused by mechanical vibrations of the MRI system relative to the imaginary plane in which the first and second posts extend receives a main input signal corresponding to an electric current in an X-coil of the gradient magnet system, which X-coil generates a gradient in the main ($B_0$) magnetic field along an X-axis extending perpendicularly to the imaginary plane in which the two posts extend, wherein a main output signal of the electronic control system corresponds to a compensating electric current which is supplied to the X-coil to generate an electronically controlled compensating gradient in the main ($B_0$) magnetic field along the X-axis, and a display configured to display images of a subject disposed in the examination region.

* * * * *